(12) United States Patent
Benedix et al.

(10) Patent No.: US 12,742,813 B2
(45) Date of Patent: Sep. 22, 2026

(54) LONGITUDINALLY SHIFTABLE ELECTRICALLY CONDUCTIVE CONTACT DEVICE

(71) Applicant: Feinmetall GmbH, Herrenberg (DE)

(72) Inventors: Lutz Benedix, Herrenberg (DE); Lorenz Gauß, Herrenberg (DE); Hans-Albert Büsse, Hachenburg (DE); Mark Daniel Flik, Herrenberg (DE)

(73) Assignee: Feinmetall GmbH, Herrenberg (DE)

( * ) Notice: Subject to any disclaimer, the term of this patent is extended or adjusted under 35 U.S.C. 154(b) by 121 days.

(21) Appl. No.: 18/577,177

(22) PCT Filed: Jul. 8, 2022

(86) PCT No.: PCT/EP2022/069102

§ 371 (c)(1),
(2) Date: Jan. 5, 2024

(87) PCT Pub. No.: WO2023/281070

PCT Pub. Date: Jan. 12, 2023

(65) Prior Publication Data

US 2024/0310430 A1 Sep. 19, 2024

(30) Foreign Application Priority Data

Jul. 8, 2021 (DE) ..................... 20 2021 103 693.1

(51) Int. Cl.

*G01R 31/28* (2006.01)
*H01R 12/72* (2011.01)
*H01R 12/91* (2011.01)

(52) U.S. Cl.

CPC ....... *G01R 31/2808* (2013.01); *H01R 12/721* (2013.01); *H01R 12/91* (2013.01); *H01R 2201/20* (2013.01)

(58) Field of Classification Search

CPC .... H01R 13/521; H01R 43/28; H01R 13/639; H01R 43/20; H01R 43/26; H01R 43/055
See application file for complete search history.

(56) References Cited

U.S. PATENT DOCUMENTS 2,831,174 A 4/1958 Hilmo
4,200,943 A * 5/1980 Fredin ................ B25B 27/0035 141/392

(Continued)

FOREIGN PATENT DOCUMENTS

DE 102007016855 A1 10/2008
DE 102016107162 A1 10/2016

OTHER PUBLICATIONS

International Search Report on Written Opinion for PCT/EP2022/069102 dated Nov. 2, 2022, 22 pages.

(Continued)

*Primary Examiner* — Huy Q Phan
*Assistant Examiner* — Temilade S Rhodes-Vivour
(74) *Attorney, Agent, or Firm* — Sheppard Mullin Richter & Hampton LLP

(57) ABSTRACT

A contact device (1) for electrically conductively contacting, in particular flat contact partners (34), with a contact head (42), which has two contact elements (7,8), which are mounted on a common carrier (2) so as to be longitudinally shiftable in a sliding direction for contacting the contact partner (34), wherein the contact elements (7,8) are mounted in such a way that they can be moved towards one another or away from one another at least partially. It is provided that the contact elements (7,8) are formed as, in particular rigid, individual parts and are guided on the carrier (2) by means of at least one slotted guide (19,20) in such a way that when inserting the contact elements (7,8) in an insertion direction (25) towards the carrier (2), the contact elements (7,8) are (Continued)

Figure 1:
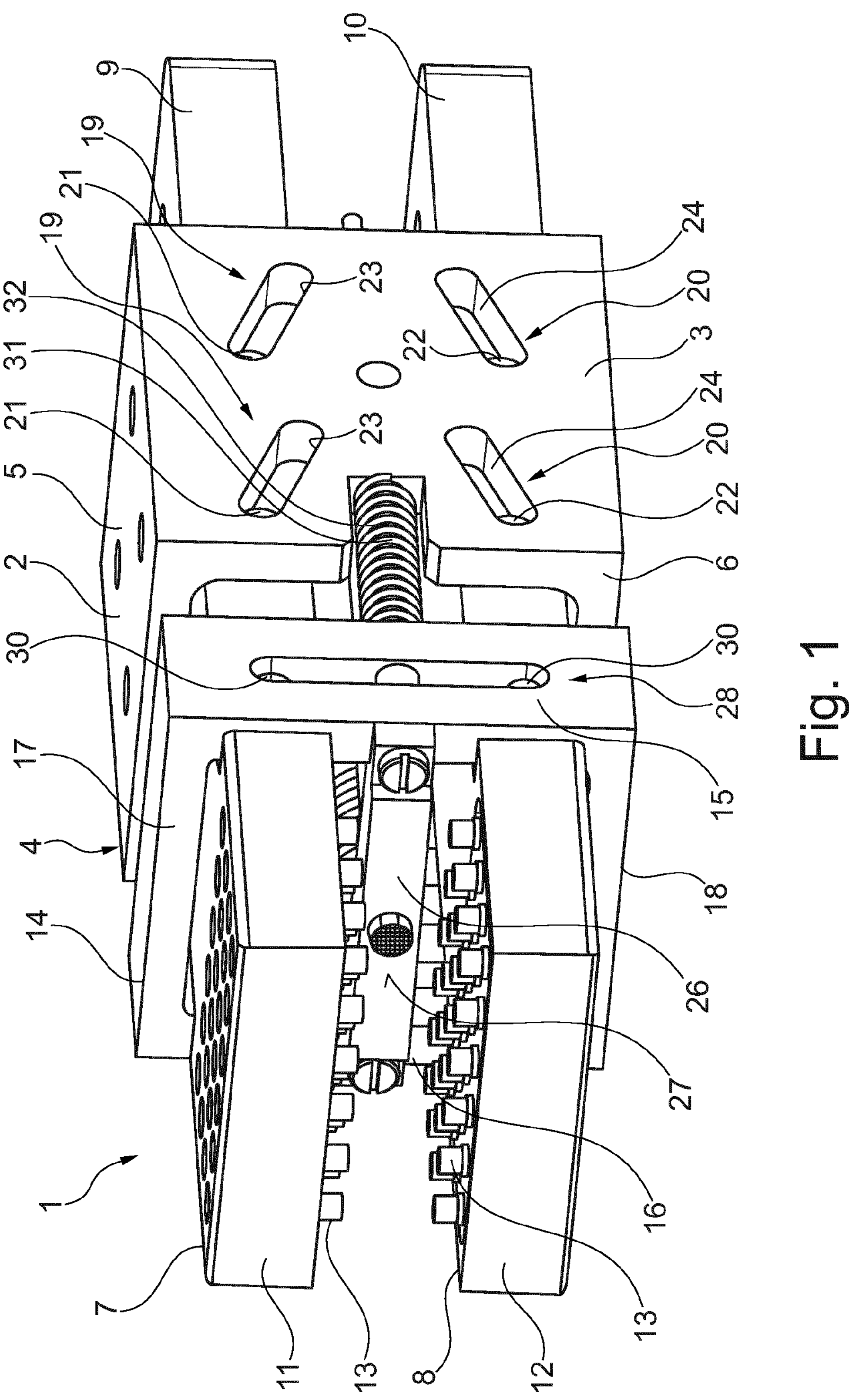

moved towards one another or away from one another at least partially.

20 Claims, 9 Drawing Sheets

(56) References Cited

U.S. PATENT DOCUMENTS

| | | | | |
|---|---|---|---|---|
| 4,966,556 | A * | 10/1990 | Reymond | H01R 12/58 439/700 |
| 7,896,710 | B2 * | 3/2011 | Deylitz | H01R 13/62922 439/682 |
| 2002/0002002 | A1 * | 1/2002 | Okabe | H01R 4/2433 439/596 |
| 2002/0076991 | A1 * | 6/2002 | Conde | H01R 12/515 439/709 |
| 2002/0086592 | A1 * | 7/2002 | Champion | H01R 12/724 439/891 |
| 2006/0160400 | A1 * | 7/2006 | Mossner | H01R 13/582 439/395 |

OTHER PUBLICATIONS

International Preliminary Report on Patentability for PCT/EP2022/069102 dated Jan. 18, 2024, 12 pages.

* cited by examiner

LONGITUDINALLY SHIFTABLE ELECTRICALLY CONDUCTIVE CONTACT DEVICE

CROSS REFERENCE TO RELATED APPLICATIONS

This application is a U.S. National Stage Application under 35 U.S.C. 371 of International Application No. PCT/EP2022/069102, filed Jul. 8, 2022, which claims priority to German Patent Application 20 2021 103 693.1, filed Jul. 8, 2021, the contents of each of which are hereby incorporated by reference in their entirety into the present disclosure.

The invention relates to a contact device for electrically conductively contacting, in particular flat contact partners, which are formed, for example, as substrates, which, on a top side and on a bottom side facing away from the top side, each have at least one electrical conductor and/or an electronic or electrical component, or as contact tongues, arresters, flat conductors, or flat plugs, comprising two contact elements, which are mounted on a common carrier so as to be longitudinally shiftable at least in a sliding direction, wherein the contact elements are mounted in such a way that they are moved towards one another or away from one another at least partially by means of the shifting.

Contact devices of the above-mentioned type are already known from the prior art. For example, the published patent application DE 10 2016 107 162 A1 thus discloses a generic contact device for contacting a flat contact partner. The contact device has a contact clamp, which is U-shaped in the longitudinal section, which is shiftably mounted in a sleeve. The free ends of the contact clamp are formed to be angled, so that they protrude laterally from the sleeve and deflect towards one another when inserting the contact clamp into the sleeve, in order to clamp and thus electrically contact the contact partner placed therebetween.

A contact device is furthermore known from the published patent application EP 0 447 798 B1, in the case of which a flat contact partner can be guided between two contact elements and the contact elements can subsequently be moved towards one another.

It is ensured with both solutions, which are already known from the prior art, that during the direct contacting of the contact partner, no relative movement of the contact partner to the contact elements takes place, which could lead to a scraping, scratching or other damages to the contact partner and/or the contact elements. While the publication mentioned first in particular provides for the testing of small surface sections of contact partner by means of elastic deformation of the contact elements themselves, the measuring of larger contact partners is also realized by means of the publication mentioned second, wherein the contact elements have to be actively moved here in order to contact the contact partner.

The invention is based on the object of improving the known contact devices to the effect that, on the one hand, the number of the performable contact processes is increased and, on the other hand, the option for electrically contacting particularly large contact partners is created as well.

The object on which the invention is based is solved by means of a contact device with the features of claim 1. Said contact device has the advantage that the contact elements themselves are formed to be robust and are thus configured for a particularly high number of contact or contacting processes, respectively. The slotted guide according to the invention furthermore allows that the contact elements can also be used with different sizes. According to the invention, it is provided that the contact elements are formed as, in particular rigid, individual parts and are guided on the carrier by means of at least one slotted guide in such a way that when inserting the contact elements in an insertion direction, thus towards the carrier, the contact elements are moved towards one another or away from one another at least partially, thus transversely to the insertion direction. Insertion direction is understood to be the direction of the sliding direction, in which the contact elements are shifted in the direction of the carrier, wherein this movement can be overlapped by a further movement, in particular transversely thereto. The sliding direction of the contact elements is thus understood to be the direction of the contact elements, in which the contact elements are in fact shifted back and forth. By means of the preferred formation of the contact elements as rigid individual parts, the contact elements obtain a high robustness and ensure a large number of contacting processes. The contact elements in particular do not display material fatigue as quickly as elastically deformable contact elements, which are deformed elastically during each test process. A systematic displacement of the contact elements during the insertion is attained by means of the slotted guides, which ensures a safe and damage-free direct contacting of the respective contact partner to be contacted. By means of the formation as individual parts, the contact elements can furthermore be replaced independently of one another, should this be necessary. Different contact elements can furthermore also be used, whereby the range of application of the contact device is increased. The contact force or the forces acting between the contact element and the contact partner, respectively, can be or is preferably also set, respectively, by means of the slotted guides in order to avoid damages, in particular to the respective contact partner. The slotted guide is thus preferably formed in such a way that the contacting force increases transversely to the insertion direction with increasing insertion depth of the contact elements. The slotted guide is in particular formed as reduction gear, so that an insertion path in the insertion direction is translated into a contact path of the contact elements, which are moved towards one another, which is shorter than the insertion path, whereby the contact force is increased compared to the insertion force with increasing insertion depth. This is attained in particular in that the guide path of the slotted guide has a specified incline towards the insertion direction, wherein the guide path optionally has at least two sections with inclines, which differ from one another, to the insertion direction. If the contact elements are moved towards one another by means of the at least one slotted guide, while the contact elements are moved towards the carrier in the insertion direction, the contact partner can thus be contacted or braced, respectively, or jammed between the contact elements. An external contacting of the contact partner is thus present then, which is formed, for example, in a pin-, rod-, or web-shaped manner, for example with a rectangular cross section. If the contact elements are moved away from one another by means of the at least one slotted guide when inserting the contact elements in the insertion direction, they are in particular suitable for contacting a sleeve-shaped contact partner, wherein an internal contacting then takes place, so that the contact elements rest against an inner wall or inner side of the contact partner in the contacting position. It goes without saying that a contact partner, which has, for example, two electrically separated contacts located opposite one another, can also be contacted in this way, wherein the contact device can then be inserted with the contact elements between these two contacts and contacts them on the sides of the contacts facing one another when shifting the contact elements away from one another. A differentiation is thus made between two cases, wherein in the first case, the contact elements are moved towards one another, and away from one another in the second case.

The contact head preferably has a slider, which is positively connected to at least one of the contact elements, preferably to both contact elements in the sliding direction, in particular in the insertion direction, and which has a stop surface for a contact partner to be tested. This has the advantage that a contact partner, which is to be contacted, impinges on the slider either on its own or directly, respectively, or, for example, by means of a housing, which is firmly connected to the contact partner, and displaces the slider and thus the contact elements by onward movement in the insertion direction, whereby the contact elements are moved towards one another. It is ensured thereby that the movement of the contact elements is synchronized in an advantageous manner with the movement of the contact partner. If the contact partner is moved onward in the insertion direction, it moves the slider, which is positively connected to the two contact elements in the insertion direction, by means of the contact with the stop surface. It is attained thereby that the contact elements are entrained and are also shifted by means of the displacement of the slider. It is ensured by means of the connection between slider and contact elements, which acts in a positive manner in the insertion direction, that no relative movements occur between the contact partner and the contact elements in the insertion direction. Whereby a slight play is optionally present in the insertion direction by providing a corresponding tolerance. By means of the onwards sliding of the contact partner in the direction of the carrier (thus by means of a displacement in the insertion direction), it is attained that the contact elements are moved towards one another, in particular partially or as a whole, by means of the slotted guide, in order to clamp the contact partner between them or in order to contact the contact partner from both sides, respectively. Due to the lack of relative movement in the insertion direction between contact element and contact partner, it follows that the contact elements are not shifted in an unwanted manner on the contact partner and can thus damage, in particular scratch, the contact partner. Alternatively, the slider is formed in such a way that a relative movement from slider to contact elements in the insertion direction takes place during the insertion, so that a desired scraping of the contact partner takes place during the direct contacting.

According to a preferred further development of the invention, the slider is arranged between the two contact elements. An actuation or shifting, respectively, of the contact elements is thus attained in particular when the contact partner is inserted between the contact elements, until it impinges on the stop surface of the slider and entrains the slider and thus the contact elements, so that the contact elements are moved towards one another and towards the contact partner transversely to the insertion direction, whereby the contact partner is clamped on both sides so as to be directly contacted by the contact elements or between the contact elements, respectively, for its contacting.

According to a further embodiment of the invention, it is preferably provided that the slider is arranged next to the contact elements. The slider thus does not lie in the intermediate space formed between the contact elements, but outside thereof, so that a contact partner can be inserted between the contact elements, without coming into contact with the slider. This is advantageous in particular if the contact partner itself has an only slight resilience, as it is the case, for example, in the case of elastically deformable contact tongues. By means of the displacement of the slider to a point outside of or next to the contact elements, respectively, it is attained that the slider can be actuated by means of a different element, which is firmly connected to the contact partner and which in particular has a higher resilience. This is the case, for example, if the contact partner is part of a larger component or substrate, which, additionally to the contact partner, for example also has a housing and/or an actuating projection, which is firmly connected to the contact partner. In the case of battery systems or electrical storages, respectively, a housing is thus often present, which has openings, through which an electrically conductive contact partner is guided in each case, in order to be able to electrically contact, for example, individual energy storage cells from outside the housing. It is ensured by means of an advantageous shaping of the housing and/or of the actuating projection that the housing or actuating projection impinges on the slider when the contact partner is inserted between the contact elements, in order to thus ensure the entrainment of the contact elements, as described above, without the actuating force having to be exerted on the slider by means of the contact partner itself.

It is furthermore preferably provided that the slider is mounted on the carrier in a longitudinally shiftable manner, in particular only in a longitudinally shiftable manner or only in a shiftable manner in its longitudinal extension, respectively. The slider is thus held on the carrier, whereby carrier and slider form a unit, which can be handled easily. By means of the longitudinally shiftable mounting of the slider on the carrier, the direction of the movement of the slider is additionally specified and a simple and safe test contacting of the contact partner by the contact device is thus ensured.

It is furthermore preferably provided that the carrier has two side walls, which are arranged spaced apart and parallel to one another, which, together with the contact elements, in each case form at least one slotted guide. The contact elements thus lie between the side walls of the carrier and are guided or mounted on both sides, respectively, by means of the slotted guides. A unique storage and shifting of the contact elements is thus ensured, by means of which, for example, a jamming or an unwanted tilting of the contact elements, in particular relative to one another, is safely prevented. The slotted guides on both sides of the respective contact element furthermore ensure that the contact force of the respective contact element, which is exerted on the contact partner, acts so as to be distributed evenly over the contact element, so that the to the contact partner are likewise impinged evenly with the contact force.

According to a preferred further development of the invention, the respective slotted guide has at least one guide depression in at least one of the side walls, preferably in each side wall, for each of the contact elements, and in each case at least one guide pin on each of the contact elements for the respective guide depression, wherein a guide pin of one of the contact elements is in each case shiftably mounted in a guide depression assigned to the contact element, the above-mentioned guide depressions, wherein the guide depressions formed in a side wall and assigned to the different contact elements are aligned so as to run towards one another at an incline in the insertion direction. The respective slotted guide is thus formed by a guide depression and a guide pin on at least one of the side walls, preferably on both side walls, wherein the guide pin is mounted in a longitudinally shiftable manner in the guide depression, thus shiftable in the longitudinal extension of the guide depression. If guide depressions of a slotted guide are present in both side walls, they are expediently formed parallel to or aligned with one another, respectively. The course of the respective guide depression thereby determines the movement path of the respective contact element. The guide depressions are in particular in each case formed in a straight line, thus resulting in a cost-efficient realization of the contact device and a safe and unique guidance of the contact elements. Due to the fact that the guide depressions run towards one another at an incline in the insertion direction, it furthermore follows in particular that the contact elements are simultaneously moved towards one another as a whole during the insertion and are thus guided towards the contact partner located therebetween. Only one or preferably both guide depressions is/are thereby aligned at an incline to the insertion direction in order to effect the contact elements to be moved towards one another during the insertion. According to an alternative embodiment of the invention, the guide depressions are not formed in a straight line, but have, for example, at least a curvature or at least a change of incline in their course. Flow speed and closing force can be influenced by means of the angle of inclination for the longitudinal adjustment or insertion direction, respectively. The angle of inclination is optionally set in such a way that a self-locking or self-clamping contacting is realized. The kinematic during the insertion process is additionally changed by means of a change of the angle of inclination in the course of the slotted guide. For example, an exponential force increase is thus generated after the contacting of the contact partner by means of the contact elements.

The respective guide depression is furthermore preferably formed as guide groove or as elongated guide hole. The elongated guide hole differs from the guide groove in that it does not have a bottom, but, in contrast, is formed in the manner of an aperture, in particular in the side wall of the carrier. If the guide depression is formed as elongated guide hole, the assigned guide pin is preferably formed in such a way that it completely or virtually completely engages through the guide depression.

Each side wall preferably in each case forms two slotted guides with each of the contact elements. The slotted guides are thereby formed in particular as described above. This results in the advantage of a unique guidance of the respective contact element, which in particular allows only one degree of freedom, namely in the sliding direction along the respective guide depression. By means of the two slotted guides for one contact element, it is ensured that the alignment of the respective contact element is also specified during the shifting. The slotted guides assigned to one contact element are particularly preferably formed identically, so that in particular the guide depressions run parallel to one another. It results therefrom that when shifting the respective contact element, the latter does not tilt, but remains in its alignment, preferably parallel to the opposite contact element, independently of the sliding position in the insertion direction. According to a further embodiment of the invention, it is preferably provided that the slotted guides of a contact element differ from one another at least partially in order to effect a tilting or pivoting of at least one of the contact elements during the shifting in the insertion direction or against the insertion direction (corresponds to the extension direction). According to an alternative embodiment of the invention, the respective slotted guide has at least one guide depression in each of the contact elements for each of the side walls, in which a guide pin is shiftably mounted on one of the side walls, wherein the guide depressions of the contact elements facing one of the side walls are aligned so as to run to one another at an incline in the insertion direction, in particular towards one another at an incline. According to the alternative embodiment, the slotted guide is thus kinematically reversed. The guide depressions of the slotted guide and the guide pins of the slotted guides are thereby preferably formed as above, apart from the arrangement of the respective other element (side wall and contact element).

According to a preferred further development, the respective two slotted guides thus run parallel to one another, as already mentioned above. It is attained thereby that the contact elements are shifted transversely to the insertion direction, without thereby changing their alignment to one another. It is in particular attained thereby that relative movements to the contact partner are reduced or avoided, whereby a particularly gentle contacting of the contact partner is ensured. Alternatively, the respective two slotted guides do not run parallel, but in particular to one another at an incline, so that an incline of the contact elements to one another is set or changed during the delivery or during the insertion, respectively. This has advantages, for example, in the case of contact partners, which are contacted internally and the entrance opening of which has a smaller cross section than the regions or zones, which are located behind it and which are to be contacted. In spite of a flat construction of the contact device, an undercut or a cross sectional tapering, respectively, of the in particular sleeve-shaped contact partner, in particular contact bushing, can be overcome.

It is furthermore preferably provided that the slotted guides for the one contact element are aligned in a first direction and for the other contact element in a second direction, so that the contact elements are either slid towards one another during the insertion through the slotted guides, in particular in a translatory manner in a first case, in order to externally contact the in particular pin- or web-shaped contact partner between them, or to be slid away from one another in a second case, in order to internally contact an in particular sleeve-shaped contact partner. By means of the alignment of the slotted guides, the function, which has already been mentioned above, that the contact elements are either moved towards one another (first case) or away from one another (second case), in particular slid in a translatory manner, is realized. Depending on whether the slotted guides lead away from one another or towards one another, the contact device is suitable for contacting a contact partner externally or internally. In the first case, the contact elements preferably have the contact means on their sides facing one another. The contact means thus lie opposite the contact partner, which is to be contacted externally, and ensure a safe electrically conductive direct contacting. In the second case, the contact elements preferably have the contact means on their sides facing away from one another, so that a contacting of a sleeve-shaped contact partner on two opposite inner sides is ensured in an advantageous manner. The respective contact means are in particular the contact means, which are described in more detail below.

According to a preferred embodiment of the invention, the contact elements lie opposite one another, viewed in the direction of movement, so that the contact elements can rest against one another in at least one position in or against the direction of movement. In particular in the first case, being located opposite one another is advantageous because the contact partner can thus be jammed or braced directly between the contact elements. During an internal contacting, however, the opposite arrangement of the contact elements is also advantageous, in order to ensure an even force distribution and to avoid a rotation or tilting of the contact device and/or of the contact partner due to the contact forces.

According to an alternative embodiment, the contact elements lie next to one another, viewed in the direction of movement. This provides the advantage, in particular in the second case, that the contact elements are arranged in a particularly installation space-save manner prior to the insertion into the contact partner. The total height of the contact device in the contact region is then defined by the height of one of the contact elements, so that particularly narrow or low openings of contact partners can thus be reached by the contact device. If the contact device has only two contact elements, which lie next to one another, a torque, which acts on the contact device and/or the contact partners, can thus be exerted by means of the eccentrically acting contact forces. In order to avoid this, it is provided according to a preferred further development of the contact device that the contact elements, which lie next to one another, are formed to engage with one another in a comb-like manner. For this purpose, preferably at least one of the contact elements has, preferably both contact elements have, several contact protrusions or lugs, wherein a contact protrusion of the other contact element lies between two respective contact protrusions of a contact element. An improved force distribution is attained thereby during the contacting, which in particular avoids that a torque is created, which has an unwanted effect on the contact partner and the contact device. The respective contact protrusion is preferably made of an electrically advantageous material, in particular in one piece with the contact element and/or preferably has a coating, which is advantageous with regard to the electrical properties.

According to a further, alternative design of the invention, the carrier has only one slotted guide for each of the contact elements, wherein the guide depressions assigned to the different contact elements are aligned so as to run away from one another at an incline in the insertion direction, and wherein the contact elements are pivotably mounted to one another between the carrier and their contact sections, which serve for the direct contacting.

The advantage results in this design that the contact elements are pivoted towards one another on their contact sections during the insertion, which likewise results in a direct contacting of the contact partner only or virtually only in a direction perpendicular to the sliding direction. Each contact element is thereby preferably mounted so as to be pivotable about its own pivot axis, wherein the pivot axes are aligned parallel to one another.

According to a preferred further development of the invention, the carrier surrounds the two contact elements as sleeve. The two contact elements are thus guided in a longitudinally shiftable manner within the sleeve. This results in a secure mounting and guidance of the contact elements as well as a robust design of the contact device as a whole. It is in particular attained by means of the ring shape or sleeve shape of the carrier that the side walls are firmly connected to one another and are aligned in a stable manner relative to one another. For this purpose, the sleeve preferably has a square or rectangular contour, which is formed by the two side walls, which in particular run straight, as well as by an upper wall connecting the side walls to one another, and a lower wall connecting the side walls to one another, wherein upper wall and lower wall are also preferably designed to be straight or flat, respectively. The contact device is preferably formed in such a way that the contact forces of the upper and of the lower contact element adapt to the same level when contacting the substrate or the contact partner, respectively, and thus cancel each other out to the surrounding sleeve. The clamping forces, which are identical on both sides, lead to the centering of the contact partner between the contact elements or kinematically vice versa to the centering of the entire pliers or of the entire contact device, respectively, relative to the position of the contact partner. The contact partner and/or the contact device are preferably plastically or elastically deformable at least partially, in order to optimize the centering function. Particularly preferably, the sleeve is fastened or can be fastened to a base carrier, to which further sleeves of further, in particular identical, contact devices can be or are fastened as well, wherein a degree of freedom is preferably present at the coupling point of the respective sleeve on the base carrier and is preferably formed by means of a floating mounting, in order to ensure an automatic alignment of the sleeve relative to the contact partner when clamping together the contact elements.

The slider particular preferably has at least one holder, which is firmly connected to the slider, wherein the contact elements are firmly connected to the holder in the sliding direction, in particular in the insertion direction, and are shiftably mounted on the holder transversely to the sliding direction, in particular perpendicular to the sliding direction. As already mentioned above, the contact elements are connected in a positive manner to the slider in the sliding direction, so that the contact elements are entrained during an impingement of the slider in the sliding direction. In order to ensure that the contact elements are advantageously moved towards one another during the insertion, they are shiftably mounted on the holder transversely to the sliding direction The contact elements can thus be moved towards one another relative to the holder, without cancelling the positive connection in the sliding direction. In particular the shifting of the contact elements on the holder, which takes place perpendicular to the sliding direction, ensures the scratch-free contacting of the contact partner. According to an alternative embodiment, the contact elements are shiftably held on the holder at an incline from the perpendicular alignment to the insertion direction, whereby a slight shifting of the contact elements on the contact partner is made possible, which effects a deliberate scraping of at least one surface of the contact partner.

Each of the contact elements particularly preferably has at least one sliding pin, which is shiftably mounted in a sliding depression, in particular groove or elongated hole, of the holder transversely to the sliding direction, in particular perpendicular to the sliding direction. The holder with the contact elements thus ultimately also in each case forms a slotted guide, which ensures the positive connection in the sliding direction and the degree of freedom of movement transversely to the sliding direction. A simple and cost-efficient coupling of contact elements and slider to one another is provided thereby. The slotted guide can also be designed kinematically vise versa in this case, whereby the respective sliding pin is then formed on the holder, and the respective sliding depression on the respective contact element. The arranging of the sliding depression on the holder has the advantage that a single sliding depression is sufficient for both sliding pins of the two contact elements.

According to an advantageous further development of the above-described alternative embodiment of the invention with pivotable contact elements, the holder, together with the respective contact element, forms the respective pivot axis. For this purpose, the respective sliding pin as bearing pin is in particular rotatably mounted in a respective bearing opening or bearing bore of the holder. The bearing pin is optionally firmly arranged on the holder and rotatably on the contact element.

The holder is preferably formed as a sleeve surrounding the contact elements. The robustness and stability of the holder is thus increased on the one hand and an improved guidance of the contact elements as well as of the slider is ensured on the other hand. It is in particular also attained by means of the sleeve shape of the holder and/or by means of the sleeve shape of the carrier that the contact elements cannot be pulled away from one another or apart, respectively, by any distance. The maximum clear width between the contact elements is thus limited in particular by means of the holder and/or the carrier.

Sliding pins and/or guide pins of the respective slotted guide are preferably arranged on both sides of the respective contact element. An even application of force is thus ensured and a canting or tilting of the contact elements is prevented. The guide pins, which are located opposite one another, of the respective contact element are thereby preferably arranged so as to be aligned with one another.

Each contact element preferably in each case has one or a plurality of electrically conductive contact means, in the first case on the side facing the other contact element, and in the second case on the side facing away from the other contact element. The contact means are, for example, contact plates, contact pins, in particular spring contact pins, contact protrusions or elevations or contact springs, which serve the purpose of electrically directly contacting the contact partner. Only one of the contact elements optionally has contact means of this type, while the opposite contact element only serves the purpose of mechanically resting on the contact partner, without establishing an electrically conductive connection to the contact partner. The electrically conductive contact means are or can be connected to a device, which is formed to perform electrical tests on the contact partner and/or to supply the contact partner with electrical energy or to absorb electrical energy of the contact partner, for example, by means of electric conductor paths, which run through the respective contact element or along the respective contact element. The device is thus formed, for example, as testing device or verifying device, respectively, or as electrical consumer or energy distributor. The contact elements are preferably formed to be continuously massive or in one piece, respectively, and have a cable connection, to which an in particular flexible connecting cable is fastened or can be fastened, in order to electrically contact the contact elements. A current-carrying terminal to/from a peripheral power supply, for example the above-mentioned device, for example a highly flexible strand, is optionally arranged on one end of at least one of the contact elements, in particular by means of cable lug. The massive/one-piece formation of the contact elements provides the advantage of a low electrical contact resistance as well as of an advantageous heat dissipation from the contact zone. The contact elements are preferably made of electrically conductive, in particular highly conductive material, in particular metal. The contact means are particularly preferably arranged directly, in particular electrically, thermally and mechanically, on the contact elements or are coupled to them, respectively, in order to minimize energy losses.

It is furthermore preferably provided that the slider has at least one electrically conductive contact means on the stop surface. This contact means can also be formed like the above-described contact means. By providing the further contact means on the stop surface, a frontal electrical contact to the contact partner is furthermore also established, whereby, for example, the number of the electrical contact points is increased. Several contact means of this type are preferably provided on the stop surface, in order to maximize the number of the electrical contact points to the contact partner. Particularly preferably, the further contact means serves for the contact partner detection, for example in the form of a contact switch, which only switches when the contact partner has been slid sufficiently far or firmly against the stop surface. According to a preferred further development of the invention, the contact device, in particular the slider, has a temperature sensor, by means of which, for example, the temperature of the contact partner and/or of the contact elements can be monitored.

According to a further embodiment of the invention, each of the contact elements preferably in each case has a scratch profile on its free front side for scraping the contact partner, which is then contacted frontally, when moving the contact elements towards one another. While in particular a contacting has been described above, in the case of which the contact partner is inserted between the contact elements and is then contacted on both sides by the contact elements, the contact device can also be used for contact partners, which are directly contacted frontally by means of the contact elements. For this purpose, the contact head is pushed, for example, onto the contact partner in against the insertion direction with the free front sides of the contact elements. The contact elements are thus impinged with an actuating force in particular also without the slider in the insertion direction and are moved towards one another by means of the advantageous slotted guide. A relative movement between the contact elements and the contact partner is thus created at the respective front side of the respective contact element resting on the contact partner. By means of the preferred formation or arrangement of a scratch profile on the respective front side, it is ensured that the contact partner to be contacted is scraped by means of the respective contact element during the direct contacting and during the sliding of the contact elements towards one another. For example, a corrosion layer or the like, which was optionally applied to the contact element, is thus penetrated by the contact elements or the scratch profiles, respectively, and a safe electrical contacting of the contact partner is ensured even in the presence of a corrosion protection layer of this type. The contact elements themselves then act as slider in this case.

It is furthermore preferably provided that the respective scratch profile has one or several protruding teeth of a tooth profile, which extend to one another in particular in the direction of movement of the contact elements. The tooth structure or the tooth profile, respectively, allows for a cost-efficient and effective formation of the respective scratch profile. By means of the preferred alignment of the contact elements in the direction of movement of the contact elements towards one another, it is attained that the teeth cut into the contact partner when contacting and displacing the contact elements in an advantageous manner, in particular in a line-shaped manner, whereby an effective electrically conductive direct contacting of the contact partner is ensured.

According to a preferred further development of the invention, a cooling device is assigned to at least one of the contact elements. By cooling the respective contact element and in particular the contact means arranged thereon, the electrical conductivity of the contact device at the contact points is improved and the efficiency and performance of the contact device is thus improved. The cooling device preferably has a cooling body, which rests flat against the contact element. At least one cooling channel for a liquid or gaseous cooling medium is particularly preferably assigned to the cooling body, so that the contact element can be actively cooled. A cooling device, as it has been described above, is optionally assigned to both contact elements. The at least one cooling device is in particular assigned to the contact zone or to a contact section of the contact element, respectively, such as in particular the region, in which the contact means are arranged as well. Alternatively, the at least one cooling device is assigned to a region spaced apart from the contact zone, in particular to a holding section of the contact element in the region of the carrier. The supply and/or discharge of the cooling medium is optionally guided through channels in the respective contact element, whereby the cooling effect is expanded. The contact elements particularly preferably have a slim construction at least in the contact section.

At least one of the contact means is preferably formed as elastically deformable or displaceable contact means, in particular as spring contact pin and/or replaceable contact means. The respective contact element can thus be easily adapted, for example in different contact partners. A simple maintenance of the contact device is furthermore also possible in that, for example, defective or worn contact means can be replaced by new ones.

According to a preferred further development of the invention, all contact means of at least one of the contact elements are formed as replaceable contact unit, in order to provide for a replacement of all contact means of the one contact element in one step.

It is furthermore preferably provided that at least one return spring is held to be pretensioned between the holder and the carrier. The holder is pretensioned by means of the return spring against the insertion direction with the spring force of the return spring, so that the holder and the contact elements are also slid out of the carrier or are slid away from the carrier when moving the contact partner back against the insertion direction, so that no relative movement of contact element to contact partner takes place in the sliding direction even when extending the contact partner. The integrity of the contact partner and of the contact means is thus maintained even when releasing the contact partner from the contact device.

The holder is preferably held on the carrier by means of at least one push rod, which is in each case slidably mounted relative to the holder or relative to the carrier or on the holder, respectively or on the carrier. Particularly preferably, the holder is shiftably held on the carrier by means of two push rods, which can be slid either relative to the carrier or relative to the holder. A secure guidance of the holder relative to the carrier is thus ensured even independently of the contact elements.

The return spring is preferably formed as coil spring and is arranged coaxially to the at least one push rod. The respective push rod in particular runs through a respective coil spring, which is formed as return spring and which is pretensioned between carrier and holder. The respective push rod thereby preferably has an axial stop, which limits a maximum slide-out length of the push rod from the carrier, so that a maximum slide-out position of the contact elements against the insertion direction is secured in a positive manner. The return spring is thereby preferably formed in such a way that it is still elastically pretensioned in the maximum slide-out position.

Figure 2A:
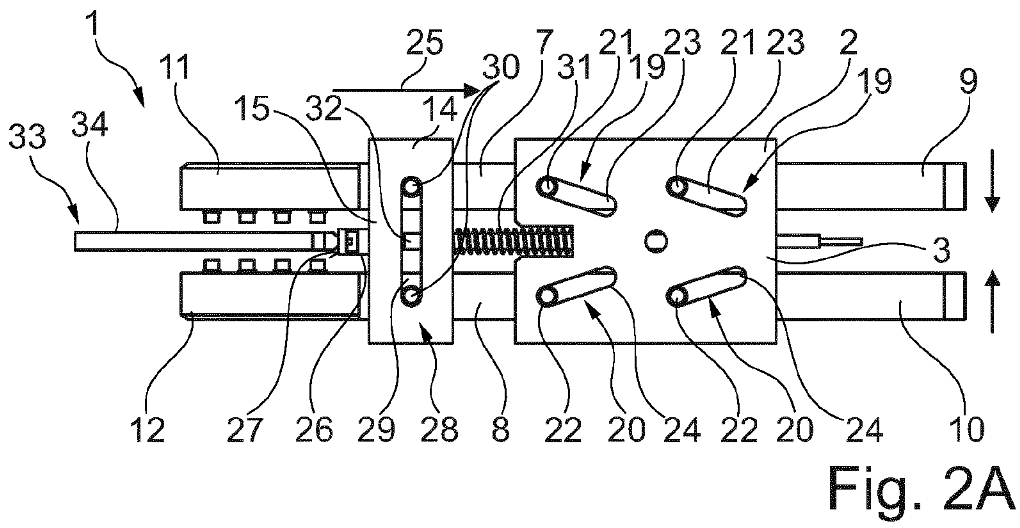
Figure 3:
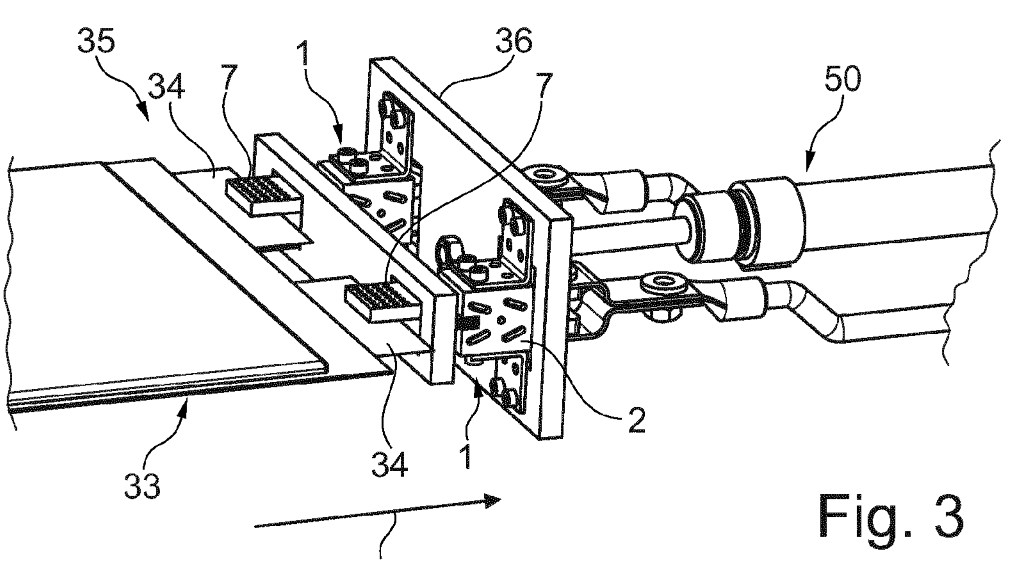
Figure 4:
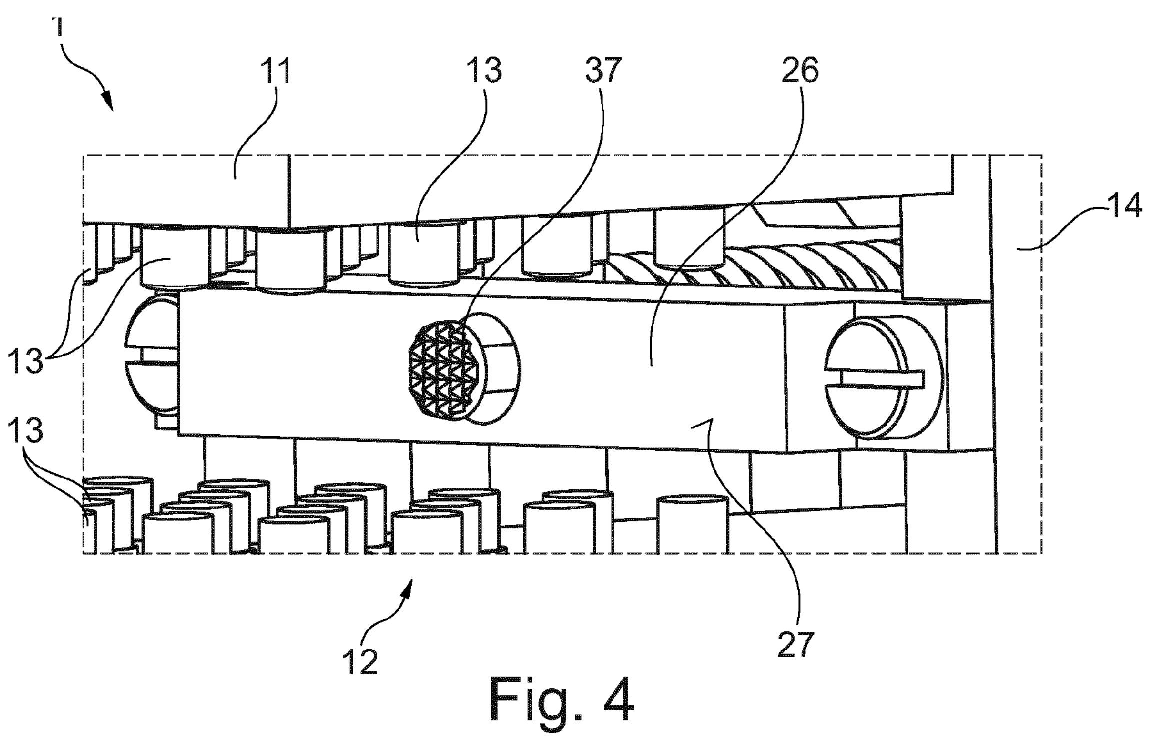
Figure 5:
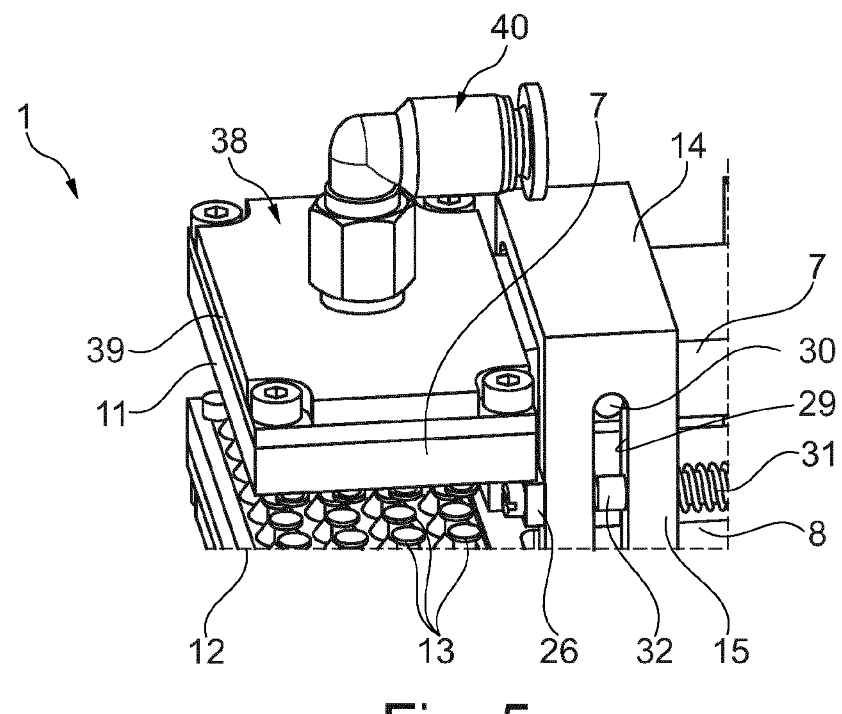
Figure 7A:
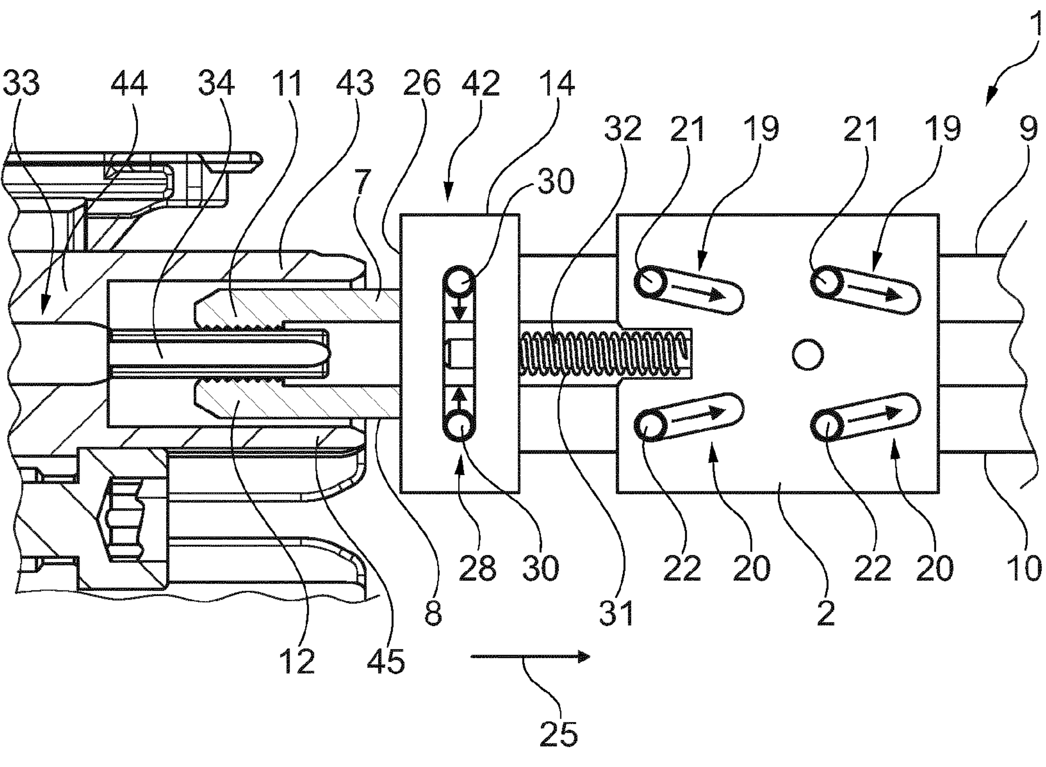
Figure 8A:
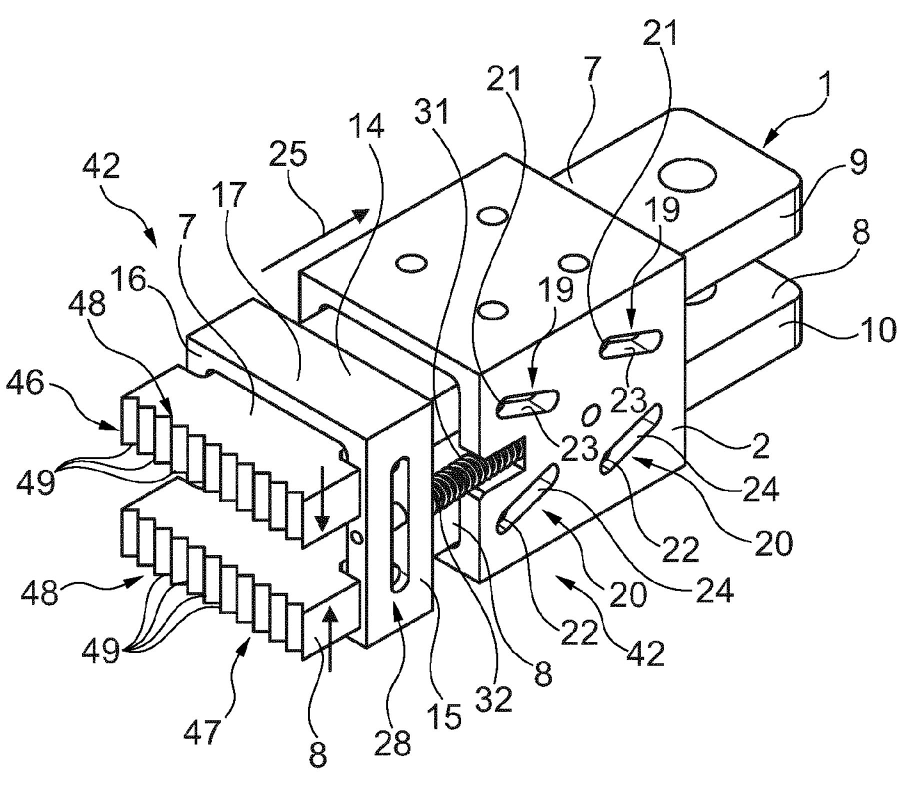
Figure 8B:
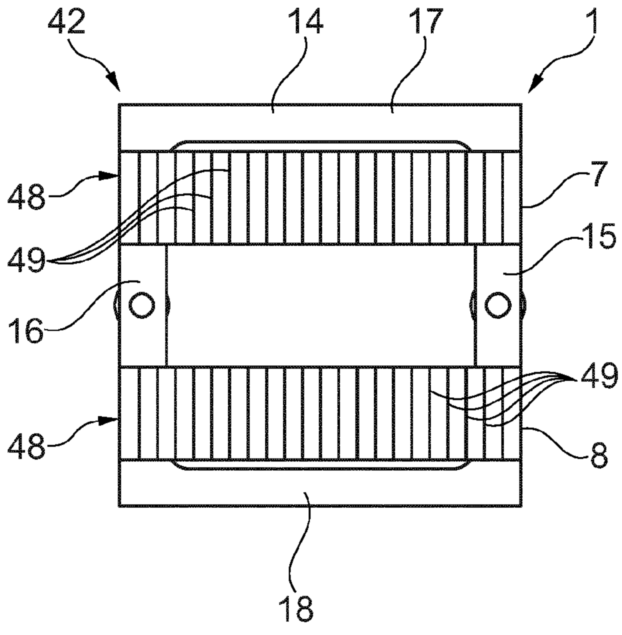
Figure 8C:
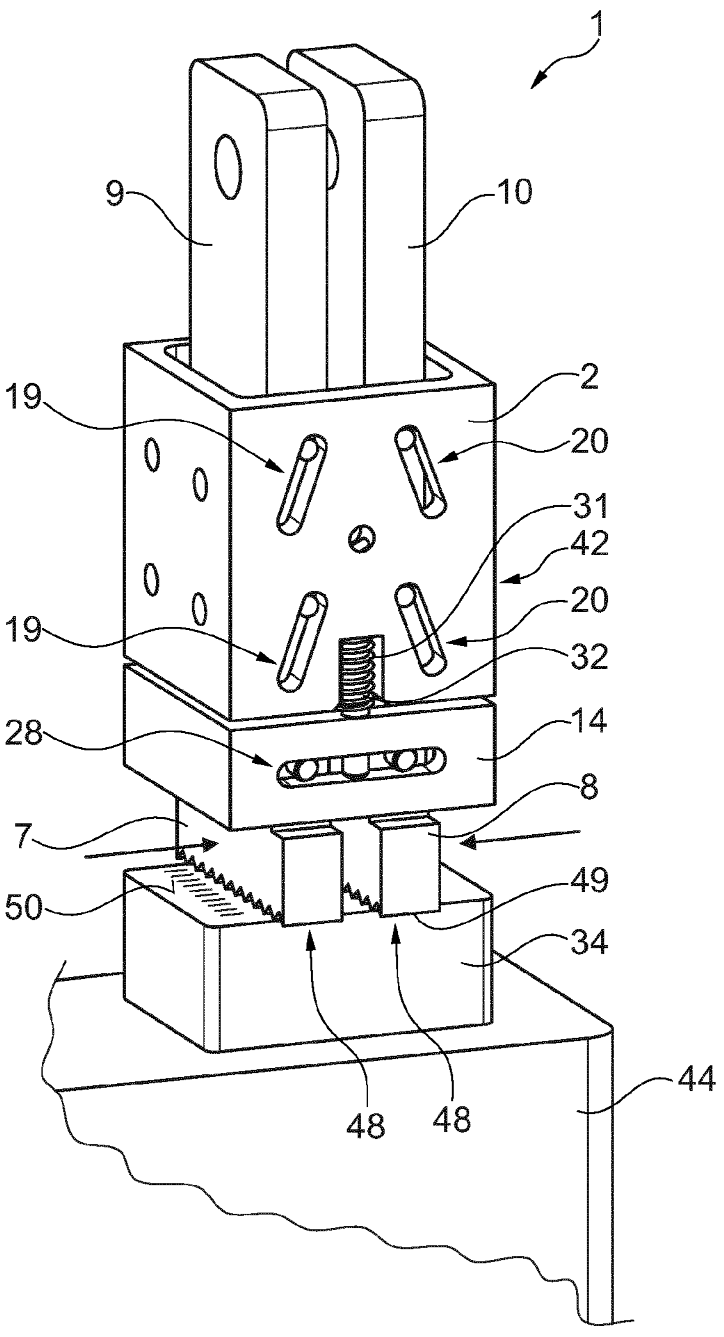
Figure 9A:
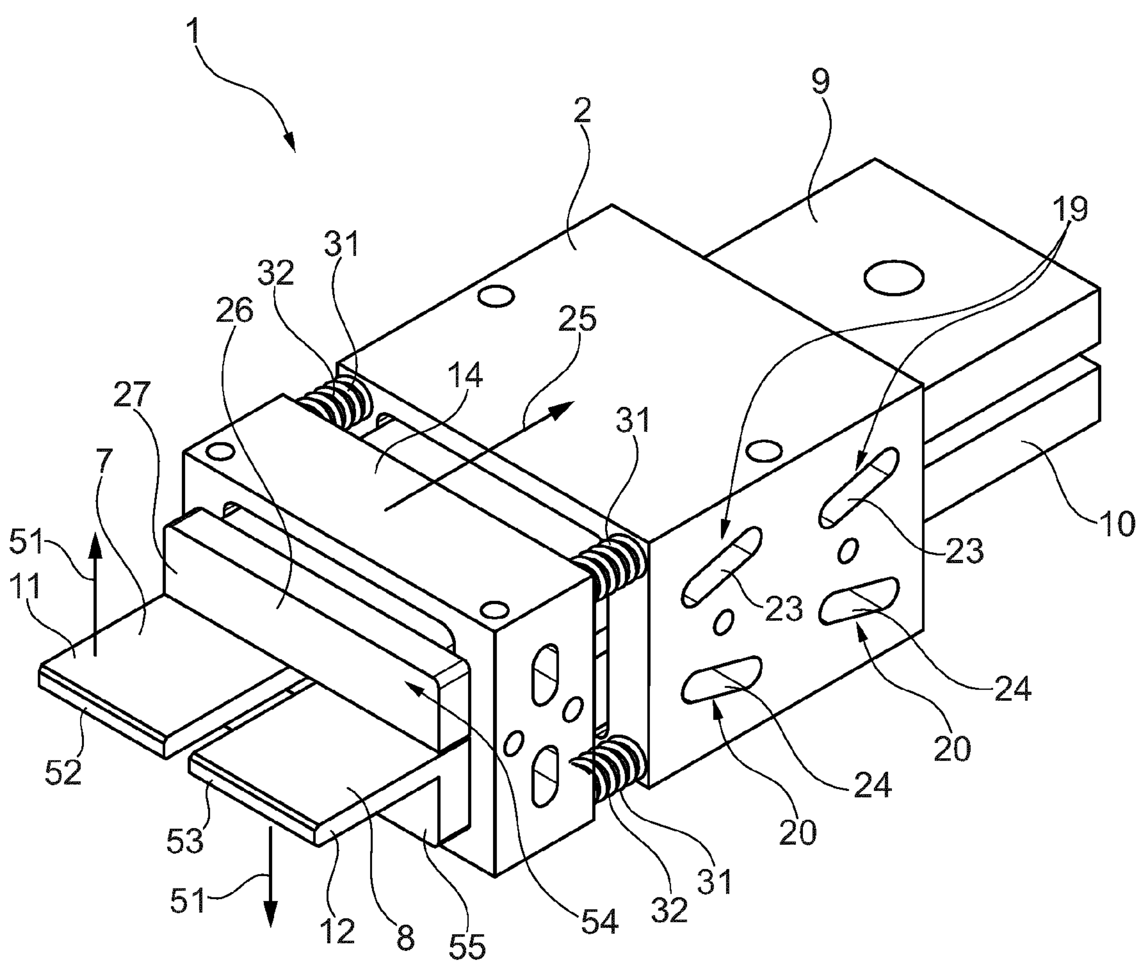
Figure 9B:
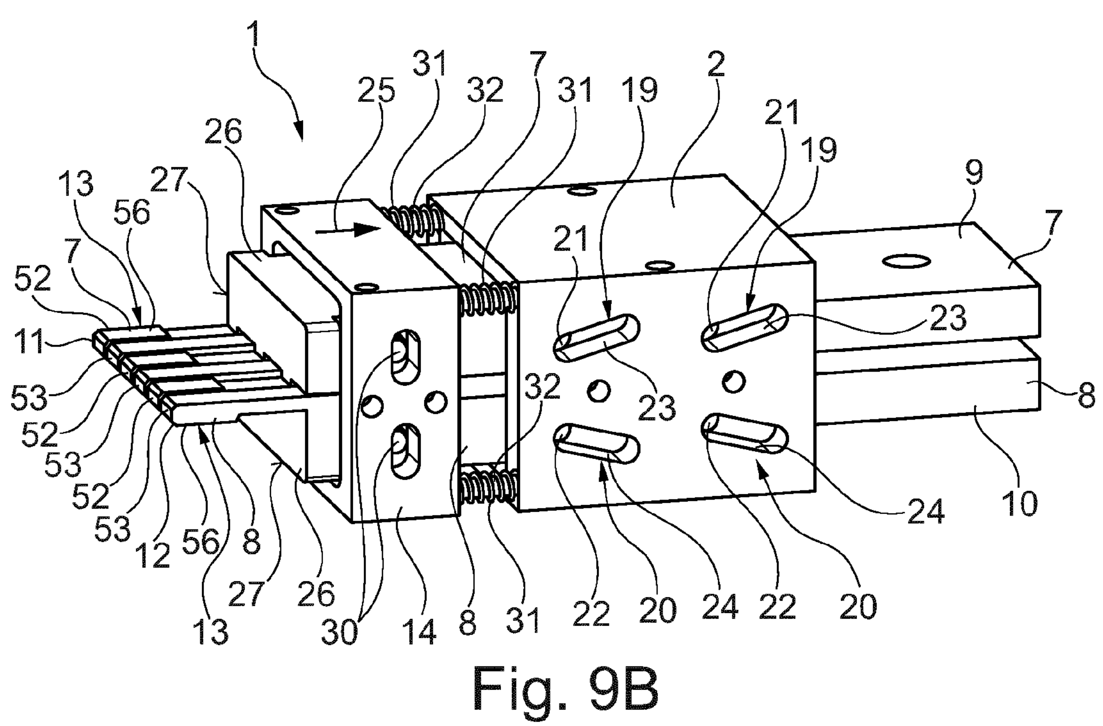
Figure 9C:
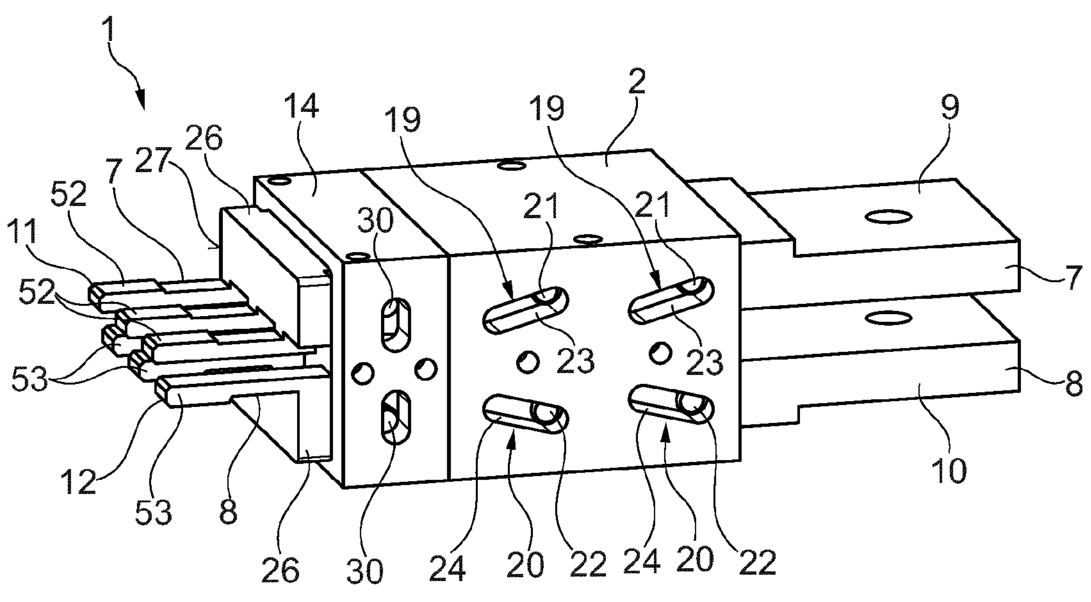

The invention will be described in more detail below on the basis of the drawing, in which FIG. 1 shows an advantageous contact device in a perspective illustration, FIGS. 2A and B show the contact device from FIG. 1 in different operating states, in each case in a simplified side view, FIG. 3 shows a contact system with the advantageous contact device in a perspective illustration, FIG. 4 shows a further exemplary embodiment of the contact device in an enlarged perspective illustration, FIG. 5 shows a further exemplary embodiment of the contact device in a perspective illustration, FIGS. 6A and B show a further exemplary embodiment of the contact device in different operating states, FIGS. 7A and B show a further exemplary embodiment of the contact device in two different operating states, in each case in a simplified side view, FIGS. 8A to C show a further exemplary embodiment of the advantageous contact device in different illustrations, and FIGS. 9A to C show a further exemplary embodiment of the advantageous contact device in different operating states.

FIG. 1 shows an advantageous contact device 1 for directly electrically contact flat contact partners, such as, for example, printed circuit boards, contact tongues, arresters, flat plugs or flat conductors, in particular of battery systems or electrical energy storages, in a perspective illustration.

The contact device 1 has a carrier 2, which has two side walls 3, 4, which are arranged spaced apart and parallel to one another, as well as an upper wall 5 and a lower wall 6, wherein the upper wall 5 and the lower wall 6 in each case connect the side walls 3, 4 to one another, so that the carrier 2 results sleeve-shaped with a polygonal contour-viewed in the cross section.

The contact device 1 furthermore has two contact elements 7, 8, which are shiftably mounted in the carrier 2. For this purpose, the contact elements 7, 8 each have a guide section 9 or 10, respectively, which penetrates the carrier 2, as well as a contact section 11 or 12, respectively, which protrudes from the carrier 2 and which serves the purpose of contacting a contact partner or a contact element or contact partners of a contact partner, respectively. The contact section 11, 12 is in particular in each case formed to be larger or wider than the guide section 9, 10. On the sides of the contact sections 11, 12 facing one another, the contact elements 7, 8 in each case have a plurality of electrically conductive contact means 13, which are formed, for example, as electrically conductive contact pins, contact springs, contact tongues, contact pins or contact receptacles. In the present exemplary embodiment, the contact means 13 are in each case formed as contact pins, which protrude from the contact sections 11, 12 in the direction of the opposite contact element 8, 7. The contact pins are preferably mounted resiliently, thus formed as spring contact pins, so that they can deflect when impinging on an electrical mating contact or on a contact partner, respectively, whereby it is ensured that all contact means 13 are brought into direct contact with the contact partner to be tested.

The contact means 13 are connected to one or several electrical conductors of the respective contact element 7, 8 either individually or in groups, in order to be able to be electrically contacted by an external device and to be impinged with an electrical test voltage, for example. According to a further exemplary embodiment, the contact elements 7, 8 as a whole are formed to be electrically conductive, so that all contact means 13 of a contact element 7, 8 are connected to the same electrical potential. The current sharing is preferably even over both contact elements 7, 8, in particular by means of the parallel electrical contact on both sides of the contact partner, in order to minimize a power loss. The entire available surface of the contact partner is preferably utilized thereby.

A holder 14 is furthermore arranged between the contact sections 11, 12 and the carrier 2, which holder is formed in a sleeve-shaped manner like the carrier 3 and which has two side walls 15, 16 for this purpose, which are arranged spaced apart and parallel to one another, and which are connected to one another by means of an upper wall 17 and a lower wall 18. The carrier 2 comprising the side walls 3, 4 and the upper wall 5 and the lower wall 6 as well as the holder 14 comprising the side walls 15, 16 and the upper wall 17 and the lower wall 18 are in each case formed in one piece and have a quadrangular outer and inner contour. Like the carrier 3, the holder 14 also surrounds the contact elements 7, 8 in a ring-shaped manner. In contrast to the carrier 3, however, the holder 14 is connected in a positive manner thereto in the longitudinal extension of the contact elements 7, 8, so that a relative movement between holder 14 and contact elements 7, 8 in the longitudinal extension of the contact elements 7, 8 is prevented. In contrast, the contact elements 7, 8 in the carrier 3 can be slid in their longitudinal extension relative to the carrier 3.

Figure 2B:
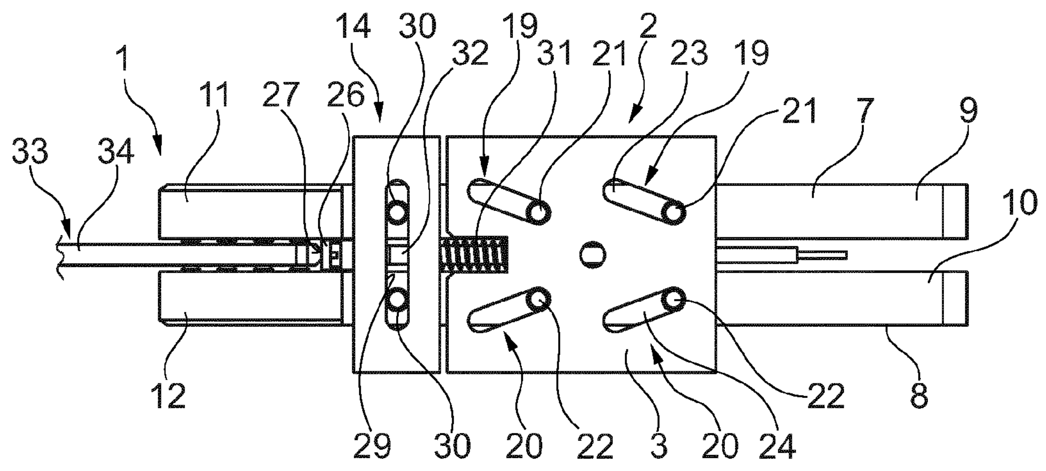

For this purpose, FIGS. 2A and 2B show the contact device 1 in different operating states, in each case in a simplified side view.

The contact elements 7, 8, together with the carrier 3, in each case form several slotted guides 19 or 20, respectively. For this purpose, the contact elements 7, 8 have, on their side surfaces, thus on those sides facing the side walls 3, 4, two guide pins 21 or 22, respectively, which protrude laterally in the direction of the respective side wall 3 or 4, respectively. Only the guide pins 21 facing the side wall 3 and slotted guides 19, 20 can be seen in FIGS. 2A and 2B.

The respective side wall 3, 4 in each case has a guide depression 23 or 24, respectively, for each of the slotted guides 19, 20. According to the present exemplary embodiment, the guide depressions 24 are formed as elongated holes, which in each case extend through the entire side wall 3 or 4, respectively. The clear width of the elongated holes or of the guide depressions 24, respectively, thereby corresponds at least essentially to the diameter of the respective assigned guide pin 21, 22. The guide pins 21, 22 are preferably formed identically. The guide depressions 23, 24 thereby run at an incline to the longitudinal extension of the contact elements 7, 8 in such a way that the guide depressions 23 in each case draw an, in in particular acute, angle with the guide depressions 24. In the present case, the guide depressions 24 are aligned to be mirrored to the guide depressions 23, based on a longitudinal central plane of the contact device 1. The guide depressions 23 are thereby in each case aligned parallel to one another, in the same way as the guide depressions 24 are aligned to one another.

If the contact elements 7, 8 are now inserted into the in particular stationary carrier 2 with the contact sections 11, 12 in the direction of the carrier 2 in the insertion direction, thus in the longitudinal extension of the contact elements 7, 8, as shown by means of an arrow 25, then the slotted guides 19, 20 have the effect that the contact elements 7, 8 are additionally moved towards one another, whereby the distance between the contact sections 11, 12 located opposite one another is reduced.

By means of the slotted guides 19, 20, the contact elements 7, 8 are thus forcibly guided on the carrier 2, so that they are moved towards one another when being inserted, thus when being shifted in the insertion direction according to arrow 25 and are moved apart from one another when being slid out, thus against the direction of the arrow 25, as is shown in FIG. 2A (slid apart) and in FIG. 2B (slid together).

It is ensured by means of the positive connection of the contact elements 7, 8 to the holder 14 in the insertion direction 25 that the contact elements 7, 8 are always shifted together. The holder 14 preferably has a slider 26, which protrudes from the holder 14 against the insertion direction and which lies between the contact sections 11, 12 of the contact elements 7, 8. The slider 26 has a stop surface 27, against which a contact partner to be tested can be slid. The slider 26 is firmly connected to the holder 14, so that a compressive force exerted on the stop surface 27 is transferred to the holder 14 and from the holder 14 to the contact elements 7, 8 for the shifting thereof.

For the positive connection of the contact elements 7, 8 to the holder 14, a further slotted guide 28 is provided, for example, as shown in Figures. The slotted guide 28 has a sliding depression 29, which extends transversely to the longitudinal extension of the contact elements 7, 8 or to the insertion direction 25, respectively, in a respective side wall 15, 16 of the holder 14. Facing the side wall 15 or 16, respectively, each contact element 7, 8 in each case has a sliding pin 30, which is mounted in a longitudinally shiftable manner in the sliding depression 29, which is preferably formed as elongated hole in the present case. The clear width of the sliding depression 29 thereby corresponds to the diameter of the sliding pins 30, whereby a positive connection is established between holder 14 and contact elements 7, 8 in the insertion direction 25, but a degree of freedom is released transversely thereto, which allows for a relative movement between contact elements 7, 8 and holder 14. By this degree of freedom or the slider guide 29 it is attained that the contact elements 7, 8 can be moved towards one another during the insertion in the direction of the carrier 2, as also shown in FIGS. 2A and 2B.

At least one return spring 31, which pushes the holder 14 away from the carrier 2 against the insertion direction 25, is preferably held in a pretensioned manner between the holder 14 and the carrier 2, so that the contact device 1 is moved into its initial position according to FIG. 2A by means of the return spring 31.

The slider 26 in particular has a push rod 32, which extends through the holder 14 and at least into the carrier 2. The slider 26 preferably has two push rods 31, which are arranged parallel to one another. The respective push rod 31 is firmly connected to the slider 26 and thus also firmly to the holder 14. In the carrier 2, however, the respective push rod 31 is mounted in a longitudinally shiftable manner, in particular only in a longitudinally shiftable manner, so that the holder 14 is mounted in a longitudinal shiftable manner relative to the carrier 3 by means of the push rod 32. The return spring 31 is thereby formed as coil spring, through which the respective push rod 31 extends. Two return springs 31 are thus also present. Alternatively, the respective push rod 31 is firmly mounted on the carrier 2 and longitudinally shiftable on the holder 14 or longitudinally shiftable on both.

The function of the contact device 1 is now designed as follows, described by means of FIGS. 2A and 2B:

To test or contact a substrate 33, the latter is inserted, for example, with an edge region or with an electrical contact partner 34, such as a contact tongue, for example, between the contact elements 7, 8 in the insertion direction 25, until the end side of the contact partner 34 impinges on the stop surface 27. The distance of the contact elements 7, 8 is preferably set so far apart from one another in the initial position that the contact partner 34 can be inserted in a contact-free manner all the way to the stop surface 27. In the initial state, the contact means 13 thus also lie spaced apart from the contact partner 34 or from the contact partner 34 thereof, respectively. If the contact partner 34 is now moved onward in the insertion direction 25, the contact partner 34 then pushes against the stop surface 27 and slides the contact elements 7, 8 into the carrier 2 by means of the holder 14, whereby the contact elements 7, 8 are forced by the slotted guides 19, 20 to move towards one another, whereby the contact means 13 is brought closer to the contact partner until all contact means 13 directly contact the contact partner 34, as shown in FIG. 2B. By means of the advantageous formation of the contact device 1, it is ensured thereby that no relative movement takes place between contact partner 34 and contact elements 7, 8 in the insertion direction 25 during the insertion and contacting of the contact partner 34. When extending or sliding or pulling the contact partner 34 out of the contact device 1, it is also ensured that no relative movement takes place in the insertion direction or against the insertion direction, respectively, between contact elements 7, 8 and the contact partner 34. It is ensured by means of the return springs 31 that the holder 14 is slid away from the carrier 2 as soon as the insertion force on the contact partner 34 is released and the contact partner 34 is pulled out in the opposite direction. The contact elements 7, 8 are thus likewise slid out and are moved away from one another by means of the slotted guides 19, 20, so that the contact means 13 release from the contact partner 34. By means of the contact elements 7, 8, only a movement transversely to the longitudinal extension of the contact partner 34 thus takes place relative to the contact partner 34, so that a scratching or damaging of the contact means 13 or of the contact partner 34 is prevented.

In the present case, both contact elements 7, 8 are formed in one piece and electrically conductively. An in particular flexible cable or a flexible conductor, respectively, for the electrical connection of the contact elements to an external device, for example test device or operating device, is preferably in each case connected on their ends on the guide section 9, 10 facing away from the respective contact section 11, 12.

FIG. 3 shows an exemplary contact system 35 in a perspective illustration, which has a base carrier 36, in which several of the contact devices 1 are arranged. A substrate 33 comprising two contact partners 34 in the form of laterally protruding contact tongues is simultaneously inserted with the contact partners 34 into the contact devices 1, so that they directly contact the respective contact partner 34, as described above. Either the contact partner 33 is thereby moved in the direction of the contact device 1 and/or the base carrier 36 is moved in the direction of the contact partner 33, for example by means of a pneumatic, hydraulic or electromotive actuator 50, as shown in FIG. 3, in order to realize the direct contacting, as it has been described with reference to FIGS. 2A and 2B. A contact system 35 of this type can have a plurality of contact devices 1, that can be arranged next to one another and/or one on top of the other, for example in a matrix-shaped manner, on the base carrier 35, in order to be able to simultaneously perform a plurality of contactings of one or several contact partners.

FIG. 4 shows a further exemplary embodiment of the contact device 1 in an enlarged perspective illustration. Elements, which are already known from the preceding exemplary embodiment, are provided with the same reference numerals, so that reference is made in this respect to the above description. Only the differences will thus essentially still be discussed below.

In contrast to the preceding exemplary embodiment, the contact device 1 according to the exemplary embodiment of FIG. 4 has a further contact means 37, which is arranged on the slider 26 in such a way that it protrudes from the stop surface 27 against the insertion direction. A further electrical connection to the contact partner 34 is thus realized. Several further contact means 37 can optionally be arranged on the slider 26. The further contact means is preferably formed as contact switch for detecting that the contact partner 34 rests completely against the stop surface 27.

FIG. 5 shows a further exemplary embodiment of the contact device 1, which differs from the preceding exemplary embodiments in particular in that a cooling device 38 is assigned at least to the contact element 7. The cooling device 38 in particular has a flat cooling body 39, which rests on the contact section 11 on the side of the contact element 7 facing away from the contact means 13. The cooling body 39 in particular has one or several cooling medium channels, through which a cooling medium can be guided in order to actively cool the contact element 7 or the contact device 1, respectively. For this purpose, the cooling body 39 in particular has a cooling medium connection 40. A corresponding cooling device 38 is optionally also assigned to the contact element 8. The shape of the contact head or of the contact sections 11, 12, respectively, also differs from the shape of the preceding exemplary embodiment. In the present case, the contact sections 11, 12 now have beveled regions, which provide for a flat direct contact with the contact partner 34 in the contact position.

Figures 6A, 6B:
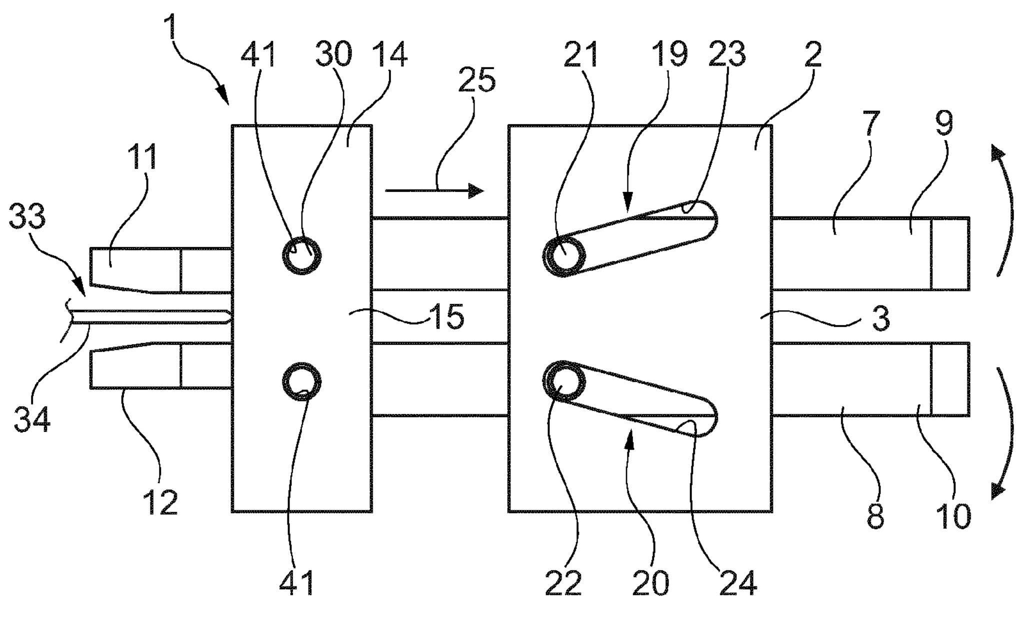

FIGS. 6A and 6B show a further exemplary embodiment of the contact device 1, which differs from the preceding exemplary embodiments of the contact device 1 in that the contact elements 7, 8 do not move towards one another in parallel through the slotted guides 19, 20, thus without changing their alignment to one another, but are tilted relative to one another. FIG. 6A thereby shows the contact device 1 in the initial state and FIG. 6B shows the contact device 1 in the direct contact state of the contact partner 34.

In contrast to the preceding exemplary embodiment, the carrier 2 with the respective contact element 7, 8 in each case only has one slotted guide on each side wall 3, 4.

The contact elements 7, 8 are additionally mounted only in a pivotable manner on the holder 14. For this purpose, the sliding pins 30 are in each case rotatably mounted in a rotary receptacle 41, in particular bore.

The guide depressions 23, 24 of the carrier 2, of which only one is in each case present in the respective side wall 3 and 4, are additional aligned to one another at an incline in such a way that they run towards one another against the insertion direction or move away from one another in the insertion direction 25, respectively, or are aligned so as to lead away from one another at an incline, respectively, in the insertion direction.

If the contact partner 33 or the contact partner 34 is now inserted between the contact elements 7, 8 or between the contact sections 11, 12 of the contact elements 7, 8, respectively, and is pushed against the holder 14 and/or the stop surface 27 of the slider 26, the contact elements 7, 8 are inserted with the contact sections 11, 12 into the carrier 2 in the direction of the carrier 2, whereby the guide pins 21, 22 are slid outwards or away from one another, respectively, by means of the guide depressions 23, 24, whereby the contact sections 11, 12 are pivoted towards one another, as shown in FIG. 6B, in order to clamp the contact partner or the contact partner 34 thereof, respectively, between the contact means 13 laterally without relative movement in the sliding direction. When pulling back the contact partner 33, the holder 14 is slid back again with the help of the return spring (not shown in FIGS. 6A and 6B for the sake of clarity) and the contact elements 7, 8 are pivoted back into their initial position according to FIG. 6A, in which the contact partner 33 is released.

FIG. 7A shows a further exemplary embodiment of the contact device 1 in a simplified side view in the non-actuated operating state. The contact head 42 thereby differs from the preceding exemplary embodiment in that the slider is not arranged as separate element between the contact elements 7, 8, so that it can be actuated by means of the contact partner 34, but next to the contact elements 7, 8, thus outside of the intermediate space formed between the contact elements 7, 8, and can be actuated by means of an actuating protrusion 43 of the substrate 33. According to the present exemplary embodiment, the slider is formed as integral part of the holder 14. In the present case, the slider 26 formed by means of a front side of the holder 14 facing the contact sections 11, 12. According to an alternative exemplary embodiment, which is not illustrated here, the slider 26 is firmly arranged on the slider as protrusion or as separate element, in order to correspondingly cooperate with the substrate or with the housing of the substrate, respectively.

The actuating protrusion 43 is in particular part of a housing 44 of the substrate 33, which also carries the contact partner 34. In the present case, the actuating protrusion 43 is formed as a protective sleeve 45, which completely surrounds the contact partner 34 on the edge side, whereby said contact partner is protected against external influences. The protective sleeve 45 thereby lies radially spaced apart from the contact partner 34, so that the contact elements 7, 8 can be inserted with the contact sections 11, 12 into an intermediate space between contact partner 34 and protective sleeve 45. The actuating protrusion 43 or the protective sleeve 45, respectively, thereby protrudes farther from the housing 44 parallel to the contact partner 34, so that the protective sleeve 45 or the actuating protrusion 43, respectively, protrudes beyond the contact partner 34 in its longitudinal extension. The actuating protrusion 43 thus impinges first on the slider 26 of the holder 14, whereby the holder 14 is entrained and the above-described kinematic for shifting the contact elements 7, 8 towards one another is effected. By mean of the advantageous formation of the contact device 1, it is also ensured thereby that no relative movement takes place in the insertion direction according to arrow 25 between the contact partner 34 and the contact elements 7, 8 during the direct contacting.

Figure 7B:
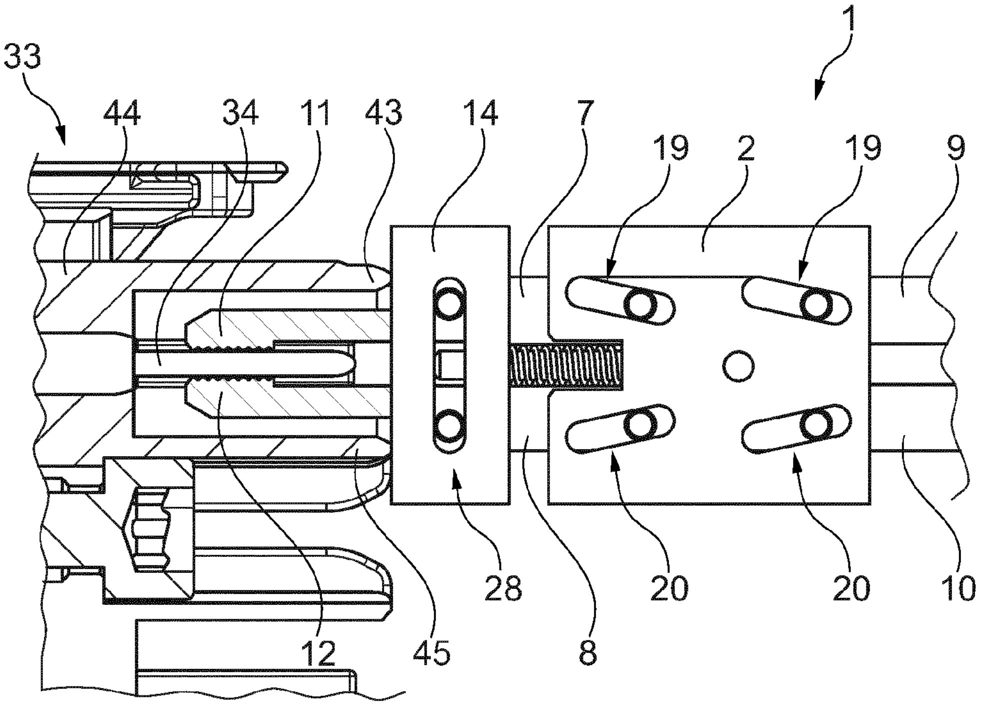

FIG. 7B shows the contacting state of the contact device 1, which is reached or effected, respectively, by means of the actuating protrusion 43 and which, except for the actuation and the formation of the slider 26, corresponds to the preceding exemplary embodiment. This exemplary embodiment is advantageous in particular when the contact partner 34 itself has a low resilience and, for example, a high elasticity, which could have the result that during a direct actuation of the slider 26 by means of the contact partner 34 itself, the latter could be damaged.

FIGS. 8A, 8B and 8C show a further exemplary embodiment of the contact device 1, which differs from the preceding exemplary embodiments in that a contacting does not take place between the contact elements 7, 8, but frontally. For this purpose, the contact elements 7, 8 each have a scratch profile 48 on their respective free front sides 46 or 47, respectively, which are to be assigned to the contact partner 34 to be contacted. According to the present exemplary embodiment, the respective scratch profile 48 is formed by means of a respective tooth structure with a plurality of teeth 49, which are arranged next to one another and which are aligned parallel to one another. The teeth 49 are thereby formed in such a way that their tooth tips in each case extend parallel to one another and parallel to the sliding direction of the slotted guide 28. The tooth tips thus run towards one another in the direction of movement of the contact elements 7, 8. FIG. 8A thereby shows the contact device 1 in a perspective illustration.

FIG. 8B shows a top view onto the contact head 42 with a view to the front sides 46, 47. It can be seen thereby that the tooth tips run parallel to one another, wherein the tooth tips of the opposite contact elements 7, 8 are in each case aligned so as to be flush with one another.

FIG. 8C shows a specific application of the correspondingly formed contact device 1 with scrape profiles 49. The contact device 1 is thereby for example placed frontally with the contact head 42 onto the contact partner 43. In contrast to the preceding exemplary embodiment, the contact partner 34 is thereby not formed to be flat in such a way that it can be inserted between the contact elements 7, 8, but in such a way that it has a contacting surface, which can be contacted frontally by both contact elements 7, 8. As soon as the contact partner 34 impinges against the front sides 49 of the contact elements 7, 8, said contact partner pushes them in the insertion direction, whereby the slotted guides 20 and 19 are actuated, so that the contact elements 7, 8 are moved towards one another, as described above, as shown by means of arrows in FIG. 8C. Due to the fact that the tooth tips of the scratch profiles 48 also extend in this direction, the teeth 49 cut into the contacting surface 50 facing the front sides 46, 47. A corrosion protection layer, for example, which was created beforehand on or applied to the contact partner 34, is thus cut through and penetrated, so that the contact elements 7, 8 electrically contact the contact partner 34 securely. FIG. 8C shows the contact device 1 in actuated or in the brought-together state, respectively, of the contact elements 7, 8.

In this exemplary embodiment, the contact elements 7, 8 themselves ultimately in each case form a slider 26, so that a separate slider 26 can be forgone. It is ensured by means of the return spring 31 that when releasing the contact device 1 from the contact partner 34, the contact elements 7, 8 are slid back into the initial position again and are moved apart from one another, so that they are available for a new contacting and scraping process.

FIGS. 9A to C show a further exemplary embodiment of the advantageous contact device 1, which differs from the exemplary embodiment of FIGS. 1 and 2 in particular in that the slotted guides 19, 20 are aligned the other way around, so that the contact elements 7, 8 are not moved towards one another but away from one another during the insertion of the contact elements 7, 8 in the direction of the carrier 2, as shown by means of arrows 51 in FIG. 9A. FIG. 9A shows a first variation of the further exemplary embodiment, in which the contact elements 7, 8 lie next to one another or at the same height, respectively, in the rebound initial position of the contact device 1. For this purpose, the contact elements 7, 8 in each case have a contact protrusion 52 or 53, respectively, wherein the contact protrusions 52, 53 protrude in the longitudinal extension of the respective contact element 7, 8 and are arranged eccentrically according to the exemplary embodiment of FIG. 9A in such a way that they lie at a height or next to one another, respectively, in the non-actuated state of the contact device 1. The contact protrusions 52, 53 are thereby in particular formed in one piece with the respective contact elements 7, 8 and are thus electrically conductive. Optionally, the contact protrusions 52, 53 additionally or alternatively carry one or several of the above-described contact means 13, 37 for electrically contacting the contact partner.

In this exemplary embodiment, the slider 26 lies next to the contact elements 7, 8 and not between them. In the present case, the slider 26 is in particular formed by a respective step or a ledge 54 or 55, respectively, of the contact elements 7, 8, which lies above or below the contact protrusions 52, 53, respectively. By means of the reverse alignment of the slotted guides 19, 20, the longitudinal grooves or guide depressions 4, 24, respectively, which lie opposite one another, run away from one another in the insertion direction according to arrow 25, so that the contact elements 7, 8 are also shifted away from one another against the force springs 31 during the insertion according to arrow 25. The contact protrusion 52 on the left in the image is thus raised and the contact protrusion 53 on the right in the image is lowered, as indicated by arrows 51. The surfaces of the contact protrusions 52, 53, which face away from one another in the direction of movement, then serve for the electrical contacting of the contact partner. This contact partner is then formed, for example, in a sleeve-shaped manner, so that the contact partner is contacted electrically internally by means of the contact device 1. For this purpose, the contact device 1 is inserted into the contact partner with the contact sections 11, 12 or with the contact protrusions 52, 53, respectively, the sleeve-shaped contact partner thereby impinges, for example, with its front side on the slider 26 and thus displaces the contact elements 7, 8 in the direction of the carrier 2 and thus away from one another according to the arrows 51, so that the contact partner is directly contacted electrically internally.

FIGS. 9B and 9C show an advantageous further development of this exemplary embodiment of FIG. 9A. For this purpose, FIG. 9B shows the contact device 1 in the non-actuated state or in its initial position, respectively, and FIG. 9C shows the contact device 1 in the actuated or deflected state, respectively.

In contrast to the exemplary embodiment of FIG. 9A, it is provided according to the exemplary embodiment of FIGS. 9B and C that the contact elements 7, 8 in each case have several contact protrusions 52 or 53, respectively. In the present case, the contact element 7 has three contact protrusions 52, and the contact element 8 has three contact protrusions 53. The contact protrusions 52, 53 are in each case arranged evenly spaced apart from one another, so that the contact elements 7, 8 engage with one another in a comb-like manner in the region of the contact protrusions 52, 53, at least when the contact protrusions 52, 53 are in the initial position of the contact device 1, as shown in FIG. 9B.

If a sleeve-shaped contact partner is contacted by means of the contact device 1, as already described above, the contact elements 7, 8 are moved apart or away from one another, respectively, transversely to the insertion direction, as shown in FIG. 9C, so that the sleeve-shaped contact partner is in each case contacted internally by the contact elements 7, 8.

The contact elements 7, 8 can also have fewer or more contact protrusions 52, 53. It is in particular also not mandatorily required that the contact elements 7, 8 have the same number of contact protrusions 52, 53. It is provided, for example, that one of the contact elements 7, 8 has one less contact protrusion 52, 53, so that an even force distribution is ensured in such a way during the contacting of the contact partner that no unwanted torque can be exerted on the contact partner. For example, the one contact element 7 or 8 thus has only one contact protrusion 52 or 53, and the other one of the contact elements 8 or 7 has two contact protrusions 53 or 52, between which the one contact protrusion 52, 53 of the one contact element 7 or 8 then lies in the initial position of the contact device 1. It goes without saying that the contact elements 7, 8 can also have more than the three shown contact protrusions 52, 53.

On its free end, the respective contact protrusion 52, 53 preferably has a cross sectional enlargement in the form of an elevation 56, which in protrudes in the direction of the contact partner and which in particular forms a contact means 13 of the respective contact element 7, 8, which is formed in one piece with the respective contact element 7, 8 and is likewise electrically conductive in this respect. It is thus ensured that the contact partner is electrically contacted only in the region of the elevation 56, so that, for example, a jamming or a canting of the contact device 1 into the contact partner is prevented. Alternatively or additionally to the cross sectional enlargement, the contact protrusions 52, 53 have one or several contact means 13, as already described above.

The invention claimed is:

1. A contact device (1) for electrically conductively contacting, in particular flat contact partners (34), with a contact head (42), which has two contact elements (7,8), which are mounted on a common carrier (2), the contact elements (7,8) configured to longitudinally shift in a sliding direction and configured to form an electrically conductive path with the contact partner (34) while contacting the contact partner (34), wherein the contact elements (7,8) are mounted in such a way that they are configured to be moved towards one another or away from one another at least partially, characterized in that the contact elements (7,8) are formed as, in particular rigid, individual parts and are guided on the carrier (2) by means of at least one slotted guide (19,20) in such a way that when inserting the contact elements (7,8) in an insertion direction (25) towards the carrier (2), the contact elements (7,8) are moved towards one another or away from one another at least partially.

2. The contact device according to claim 1, characterized in that between the contact elements (7,8), the contact head (42) has a slider (26), which is connected in a positive manner to both contact elements (7,8) in the sliding direction, in particular in the insertion direction, and has a stop surface (27) for the contact partner (34).

3. The contact device according to claim 1, characterized in that the slider (26) is arranged between the contact elements (7,8).

4. The contact device according to claim 2, characterized in that the slider (26) is mounted on the carrier (2) in a longitudinally shiftable manner, in particular only in a longitudinally shiftable manner.

5. The contact device according to claim 1, characterized in that the carrier (2) has two side walls (3,4), which are arranged spaced apart and parallel to one another, which, together with the contact elements (7,8), in each case form at least one slotted guide (19,20).

6. The contact device according to claim 1, characterized in that the respective slotted guide (19,20) has at least one guide depression (23,24) in at least one side wall (3,4), in particular in each side wall (3,4), for each of the contact elements (7,8), and in each case at least one guide pin (21,22) on each of the contact elements (7,8), wherein a guide pin (21,22) of one of the contact elements (7,8) is in each case shiftably mounted in a guide depression (23,24)

assigned to the contact element (7,8), wherein the guide depressions (23,24) formed in a side wall (3,4) are aligned so as to run towards one another or away from one another.

7. The contact device according to claim 1, characterized in that the respective guide depression (23,24) has at least a curvature or at least a change of incline in its course.

8. The contact device according to claim 1, characterized in that each side wall (3,4) in each case forms two slotted guides (19,20) with each of the contact elements (7,8).

9. The contact device according to claim 8, characterized in that the respective two slotted guides (19,20) run parallel or at an incline to one another.

10. The contact device according to claim 9, characterized in that the slotted guides for the one contact element (7,8) are aligned in a first direction and for the other contact element (8,7) in a second direction, so that the contact elements (7,8) are either slid towards one another during the insertion through the slotted guides (19,20) in a first case, in order to externally contact the in particular pin-or web-shaped contact partner between them, or to be slid away from one another in a second case, in order to internally contact an in particular sleeve-shaped contact partner.

11. The contact device according to claim 1, characterized in that the contact elements (7,8) lie opposite one another, viewed in the direction of movement.

12. The contact device according to claim 1, characterized in that the contact elements (7,8) lie next to one another, viewed in the direction of movement.

13. The contact device according to claim 12, characterized in that the contact elements (7,8) are formed to engage with one another in a comb-like manner.

14. The contact device according to claim 1, characterized in that the carrier (2) has only one slotted guide (19,20) for each of the contact elements (7,8), wherein the guide depressions (23,24) assigned to the different contact elements (7,8) are aligned so as to run away from one another at an incline in the insertion direction (25), and wherein the contact elements (7,8) are pivotably mounted to one another between the carrier (2) and their contact sections (11,12), which serve for the direct contacting.

15. The contact device according to claim 1, characterized in that the carrier (2) comprises a sleeve surrounding the two contact elements (7,8) in a ring-shaped manner.

16. The contact device according to claim 1, characterized in that the slider (26) has at least one holder (14), which is firmly connected to the slider (26), and that the contact elements (7,8) are firmly connected to the holder (14) in the sliding direction, and are shiftably mounted on the holder (14) transversely to the sliding direction, in particular perpendicular to the sliding direction.

17. The contact device according to claim 1, characterized in that each contact element (7,8) has at least one sliding pin (30), which is shiftably mounted in a sliding depression (29), in particular groove or elongated hole, of the holder (14) transversely to the sliding direction.

18. The contact device according to claim 1, characterized in that the slider (26) has at least one holder (14), which is firmly connected to the slider (26), and that the contact elements (7,8) are firmly connected to the holder (14) in the sliding direction, and that the holder (14), together with the respective contact element (7,8), forms a respective pivot axis.

19. The contact device according to claim 1, characterized in that each contact element (7,8) in each case has one or a plurality of electrically conductive contact means (13), in the first case on the side facing the other contact element (8,7), and in the second case on the side facing away from the other contact element (8,7).

20. The contact device according to claim 1, characterized in that each contact element (7,8) in each case has a scratch profile (48) on its free front side (46,47) for scraping the contact partner (34), which is contacted frontally, when moving the contact elements (7,8) towards one another.

* * * * *